(12) United States Patent
Lai

(10) Patent No.: US 7,632,377 B2
(45) Date of Patent: Dec. 15, 2009

(54) DRY ETCHING APPARATUS CAPABLE OF MONITORING MOTION OF WAP RING THEREOF

(75) Inventor: Shyh-Kuen Lai, Tai-Nan (TW)

(73) Assignee: United Microelectronics Corp., Hsin-Chu (TW)

( * ) Notice: Subject to any disclaimer, the term of this patent is extended or adjusted under 35 U.S.C. 154(b) by 451 days.

(21) Appl. No.: 11/307,106

(22) Filed: Jan. 24, 2006

(65) Prior Publication Data
US 2007/0169888 A1 Jul. 26, 2007

(51) Int. Cl.
*C23F 1/00* (2006.01)
(52) U.S. Cl. .............. 156/345.24; 156/345.47; 156/915; 33/366.11
(58) Field of Classification Search .......... 33/365, 33/366.11, 613, 645
See application file for complete search history.

(56) References Cited

U.S. PATENT DOCUMENTS 5,322,993 A * 6/1994 Ohyama .............. 369/118
6,019,060 A * 2/2000 Lenz .............. 118/723 R
6,096,161 A 8/2000 Kim
6,125,788 A 10/2000 Hills
6,506,685 B2 1/2003 Li
6,527,911 B1 3/2003 Yen
2004/0085530 A1 * 5/2004 Braune et al. .............. 356/213

FOREIGN PATENT DOCUMENTS

| TW | 535234 | 6/2003 |
|---|---|---|
| TW | 587272 | 5/2004 |
| TW | 200410602 | 6/2004 |
| TW | 1238261 | 8/2005 |

* cited by examiner

*Primary Examiner*—Michael Cleveland
*Assistant Examiner*—Nathan K Ford
(74) *Attorney, Agent, or Firm*—Winston Hsu

(57) ABSTRACT

An optical monitoring system includes a ring-shaped object suspended by and engaged with a plurality of vertical plunger shafts. Normally, the vertical plunger shafts move upward and downward reciprocally and coherently, but independently, such that the ring-shaped object ascends or descends horizontally. A light transceiver device is affixed to one vertical plunger shaft. A plurality optical reflector elements are affixed to respective other plunger shafts. A light beam emanated from said light transceiver is reflected by the optical reflector elements and is eventually re-directed back to the light transceiver device.

22 Claims, 6 Drawing Sheets

DRY ETCHING APPARATUS CAPABLE OF MONITORING MOTION OF WAP RING THEREOF

BACKGROUND OF THE INVENTION

1. Field of the Invention

The present invention relates generally to an apparatus for manufacturing a semiconductor device and, more particularly, to a dry etching apparatus capable of monitoring the motion of the wafer area pressure (WAP) ring and the plunger shafts that actuate the WAP ring.

2. Description of the Prior Art

Plasma etching has become the preferred technique for etching patterns in the various layers utilized in the manufacture of integrated circuit devices. The apparatus for such etching typically includes a chamber housing a pair of essentially planar electrodes that are spaced apart in a parallel relationship to define an interaction space therebetween. On a lower electrode is positioned a semiconductor wafer being processed. For such processing, an appropriate gaseous medium is introduced into the chamber and then one or more suitable high radio-frequency voltages are impressed across the pair of electrodes to generate discharge and form plasma that etches suitably exposed regions of the wafer.

It has become of increasing importance both for efficiency and for uniformity to confine the plasma essentially to the interaction space between the two electrodes. To this end, it has been proposed to include a ring-shaped element (a plasma confinement ring) at the periphery of one or both of the electrodes to confine the discharge to the interaction space. Such plasma confinement ring is also known as a wafer area pressure (WAP) ring, which is provided to confine the plasma stream to the area of the wafer.

FIG. 1 is a schematic, cross-sectional diagram illustrating the arrangement of a top electrode and WAP ring of a conventional plasma etching apparatus. As shown in FIG. 1, the plasma etching apparatus 10 comprises a lower assembly 12 and an upper portion 13. The lower assembly 12 generally includes a disk-shaped electrostatic chuck (ESC) 12a, a focus ring 12b, and a ground ring 12c. The ESC 12a is capable of holding a wafer 20 and is typically serves as a bottom electrode or anode. The focus ring 12b extends around a peripheral portion of the ESC 12a. The upper portion 13 generally includes a top electrode or cathode 14 and a WAP ring 16. The WAP ring 16 encircles the top electrode 14. Typically, the WAP ring 16 includes a thicker twist ring 16a and three thinner lower rings 16b, 16c and 16d. Both the lower assembly 12 and the upper portion 13 are installed in a chamber housing 25.

Generally, the WAP ring 16 is connected to three plunger shafts 32 (only one of the three shafts is shown). One end of each of the three plunger shafts 32 is further connected with a movable lower roller 34. The lower roller 34 is bonded to a corresponding fixed upper roller 36 with a resilient means such as spring (not shown). An annular cam 40 reciprocally moves along the direction 42 between the lower roller 34 and the upper roller 36 such that the WAP ring 16 descends and ascends between the "home position" as shown in FIG. 1 and the "work position" as shown in FIG. 2.

One drawback of the above-described prior art is that a gap 18 between the top electrode 14 and the WAP ring 16 is very small, which is typically about 0.02 inch or less. During the descending and ascending of the WAP ring 16, even very small discrepancy between the three plunger shafts 32 results in oblique WAP ring and undesired rubbing or scratching of the top electrode 14 and the WAP ring 16, thus causing particle contamination of the chamber or wafer. The discrepancy between the three plunger shafts 32 may result from fatigue of the spring or worn rollers or parts.

It is desirable to precisely control the descending and ascending of the WAP ring 16 in a horizontal manner and to provide a system to monitor the abnormal motion of each of the three plunger shafts 32 during descending and ascending of the WAP ring 16, thereby preventing particle contamination of the chamber or wafer.

SUMMARY OF THE INVENTION

It is one object of the present invention to provide an alarm and monitor system to detect the abnormal motion of each of the plunger shafts during descending and ascending of the WAP ring, thereby preventing particle contamination of the chamber or wafer.

From one aspect, the present invention provides a dry etching apparatus capable of monitoring motion of a wafer-area-pressure (WAP) ring. The dry etching apparatus includes a chamber housing encompassing an upper portion and a lower assembly, the upper portion further comprising the WAP ring encircling a top electrode; plunger shafts engaging with the WAP ring, wherein the plunger shafts are connected to respective movable lower rollers that are bonded to corresponding fixed upper rollers by using a resilient means; an annular cam reciprocally moves between the lower roller and the upper roller along a predetermined direction to protrude the WAP ring downward from the top electrode; and an optical monitoring system comprising a light transceiver device and optical reflector elements affixed to respective the lower rollers or the plunger shafts, wherein a light beam emanated from the light transceiver is reflected by the optical reflector elements and is re-directed back to the light transceiver device.

From another aspect, the present invention provides an optical monitoring system for monitoring horizontal ascending or descending of a suspended ring-shaped or disk-shaped object. The optical monitoring system includes a ring-shaped or disk-shaped object suspended by and engaged with a plurality vertical plunger shafts, wherein, normally, the vertical plunger shafts move upward and downward reciprocally and coherently, but independently, such that the ring-shaped or disk-shaped object ascends or descends horizontally; a light transceiver device affixed to one of the vertical plunger shafts; and a plurality of optical reflector elements affixed to respective other the plunger shafts, wherein a light beam emanated from the light transceiver is reflected by the optical reflector elements and is eventually re-directed back to the light transceiver device.

From still another aspect, the present invention provides an optical monitoring system for monitoring deformation of an object. The optical monitoring system includes a light transceiver device affixed to one position of the object; and a plurality optical reflector elements affixed to respective other positions of the object, wherein a light beam emanated from the light transceiver is reflected by the optical reflector elements and is eventually re-directed back to the light transceiver device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
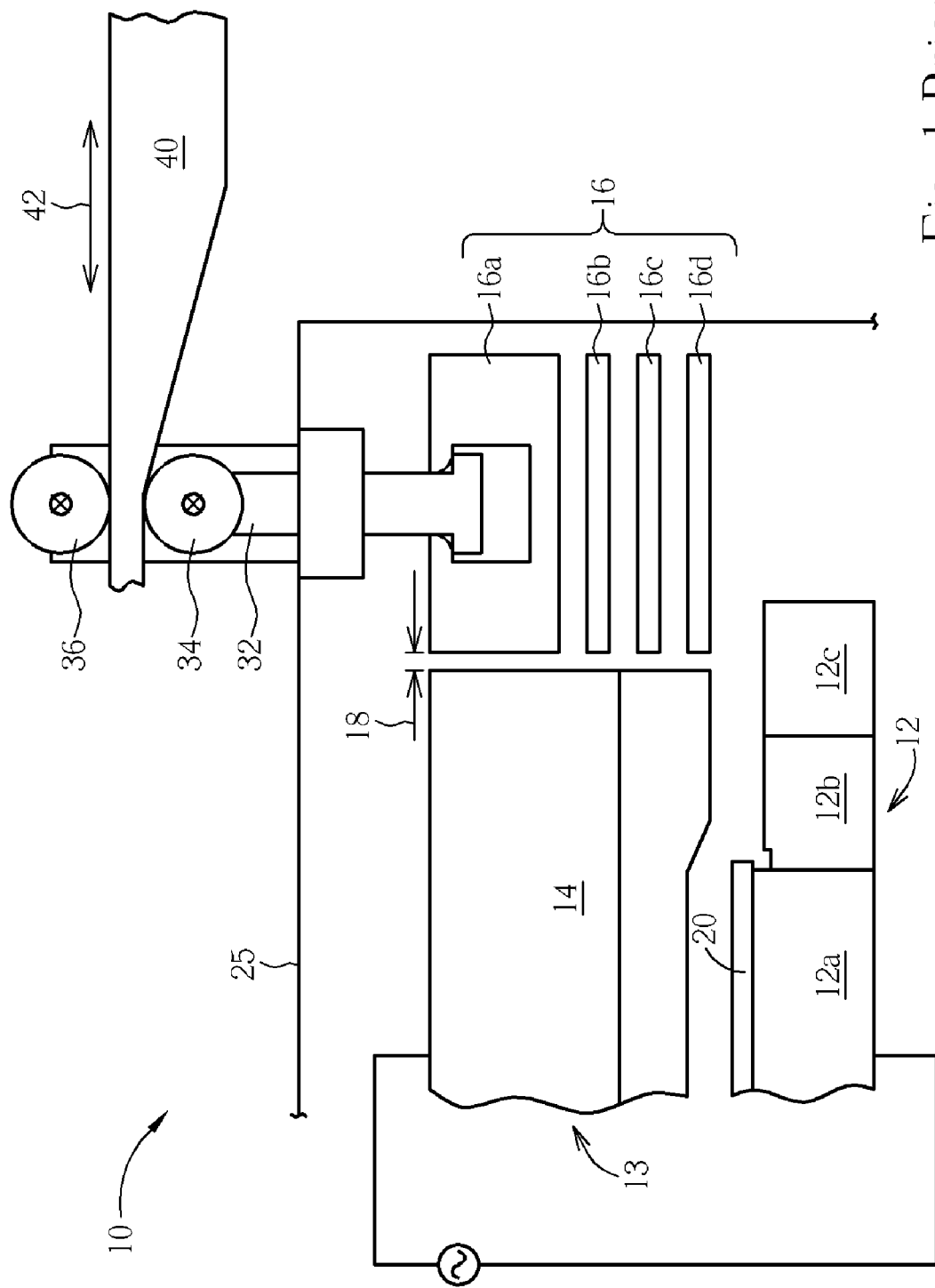
FIG. 1 is a schematic, cross-sectional diagram illustrating the arrangement of a top electrode and WAP ring of a conventional plasma etching apparatus.
Figure 2:
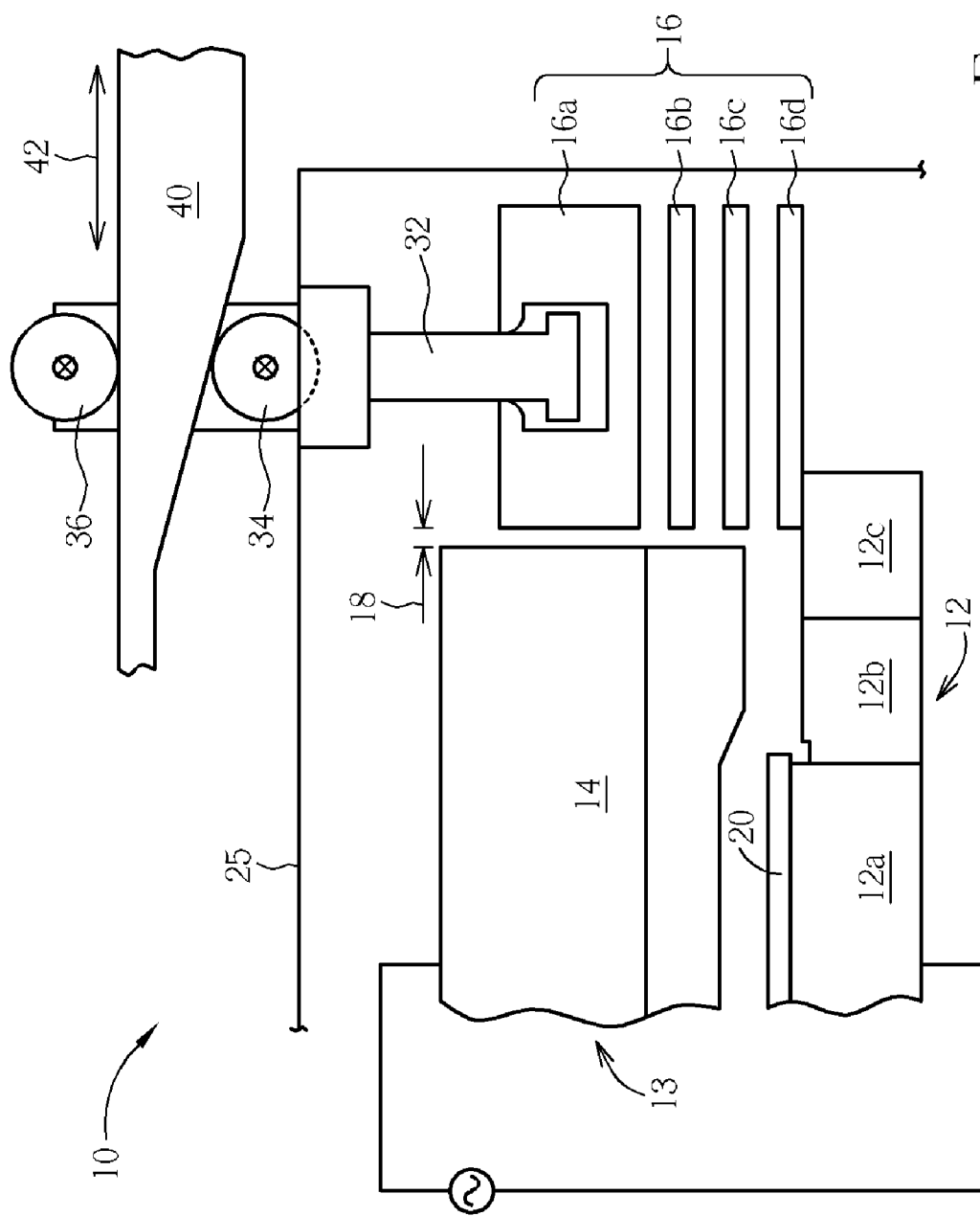
FIG. 2 is a schematic, cross-sectional diagram illustrating the WAP ring in "work position" according to the prior art.

The present invention will now be described in more detail hereinafter with reference to the accompanying drawings. In the drawings, the size and relative position of the elements of the dry etching apparatus are exaggerated for the sake of clarity. Furthermore, like numeral numbers refer to like elements throughout the drawings.

Figure 3:
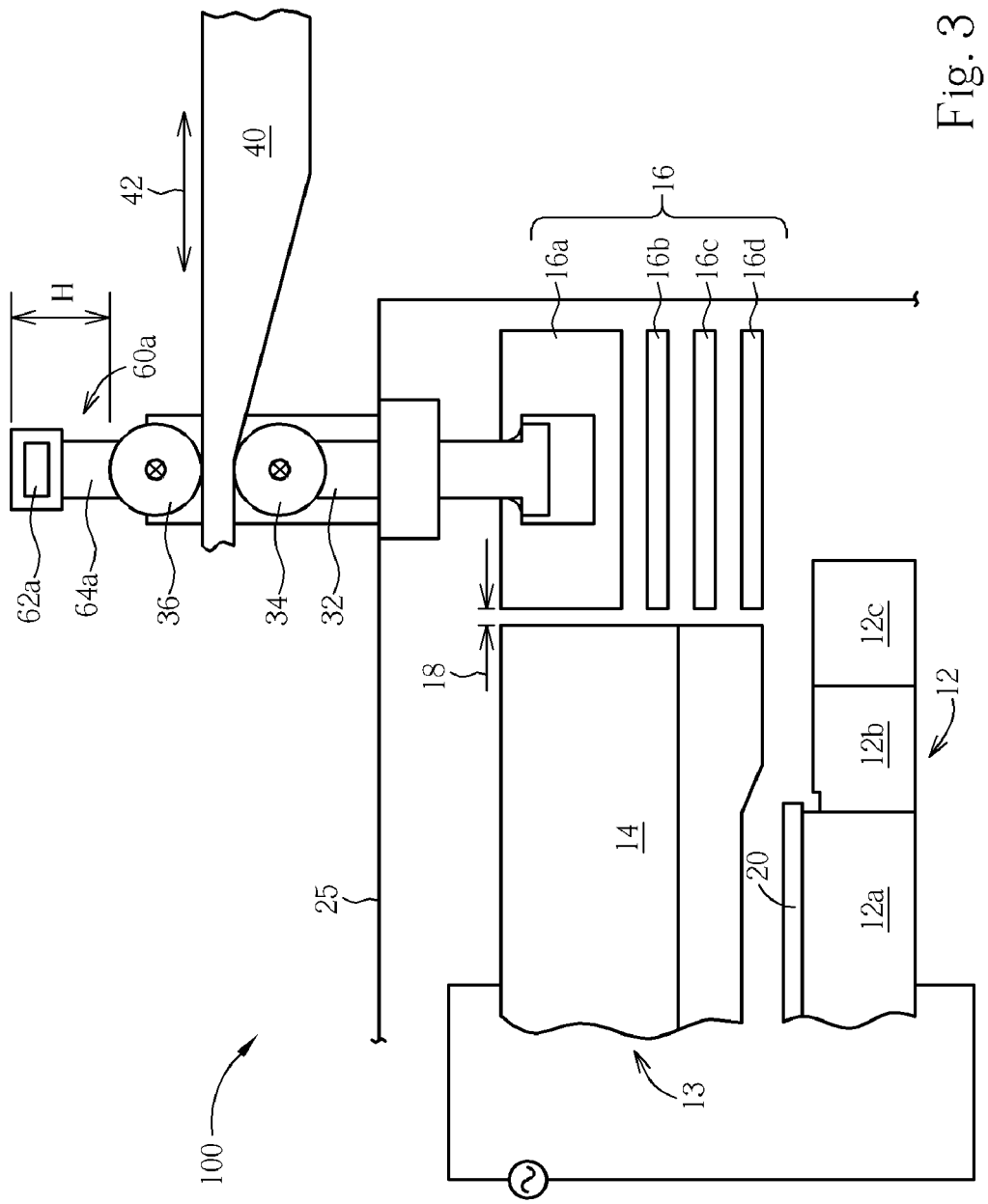
FIG. 3 is a schematic, cross-sectional diagram illustrating the arrangement of WAP ring, plunger shaft and optical monitoring system of a dry etching apparatus in accordance with one preferred embodiment of this invention.

Please refer to FIG. 3. FIG. 3 is a schematic, cross-sectional diagram illustrating the arrangement of WAP ring, plunger shaft and optical monitoring system of a dry etching apparatus in accordance with one preferred embodiment of this invention. The dry etching apparatus 100 comprises a lower assembly 12 and an upper portion 13. Both the lower assembly 12 and the upper portion 13 are installed in a chamber housing 25.

The lower assembly 12 generally includes a disk-shaped electrostatic chuck (ESC) 12a, a focus ring 12b, and a ground ring 12c. The ESC 12a is capable of holding a wafer 20 and is typically serves as a bottom electrode or anode. The focus ring 12b extends around a peripheral portion of the ESC 12a and is provided to enhance the uniformity of the plasma density. The focus ring 12b may be made of pure aluminum, anodized aluminum or stainless steel, among others.

Likewise, the upper portion 13 generally includes a top electrode or cathode 14 and a WAP ring 16. The WAP ring 16 encircles the top electrode 14. Typically, the WAP ring 16 includes a thicker twist ring 16a and three thinner lower rings 16b, 16c and 16d, but not limited thereto. During a plasma etching process, the WAP ring 16 descends, and touches the ground ring 12c, to confine the plasma generated between the two parallel electrodes to an area corresponding to the projected area of the wafer 20.

The WAP ring 16 may be made of quartz, ceramic, or materials, which are not damaged by plasma. During a plasma etching process, reaction gas flows into the chamber through the gas inlet conduits disposed at the center of the top electrode 14. A baffle (not shown) may be installed atop the top electrode 14. The reacted gas is exhausted from the chamber by using a vacuum pump (not shown).

The WAP ring 16 is engaged with three plunger shafts 32 (only one of the three shafts is shown in FIG. 3). One end of each of the three plunger shafts 32 is further connected with a movable lower roller 34. The lower roller 34 is bonded to a corresponding fixed upper roller 36 with a resilient means such as spring (not shown). An annular cam 40 reciprocally moves between the lower roller 34 and the upper roller 36 such that the WAP ring 16 can descend or ascend during the etching processing.

When the reaction gas is injected into the chamber and the power is applied to the cathode and the anode by the RF power supply, an RF electrical field is formed between the cathode and the anode and the reaction gas is converted to plasma by the RF electrical field. The plasma impinges the wafer 20 supported on the anode, thereby dry etching the wafer.

As previously mentioned, the gap 18 between the top electrode 14 and the WAP ring 16 is small. Slight discrepancy between the three plunger shafts 32 results in oblique WAP ring and undesired scratching of the top electrode 14 and the WAP ring 16, thus causing particle contamination of the chamber or wafer. The discrepancy between the three plunger shafts 32 may result from fatigue of the spring or worn rollers or parts.

Figure 4:
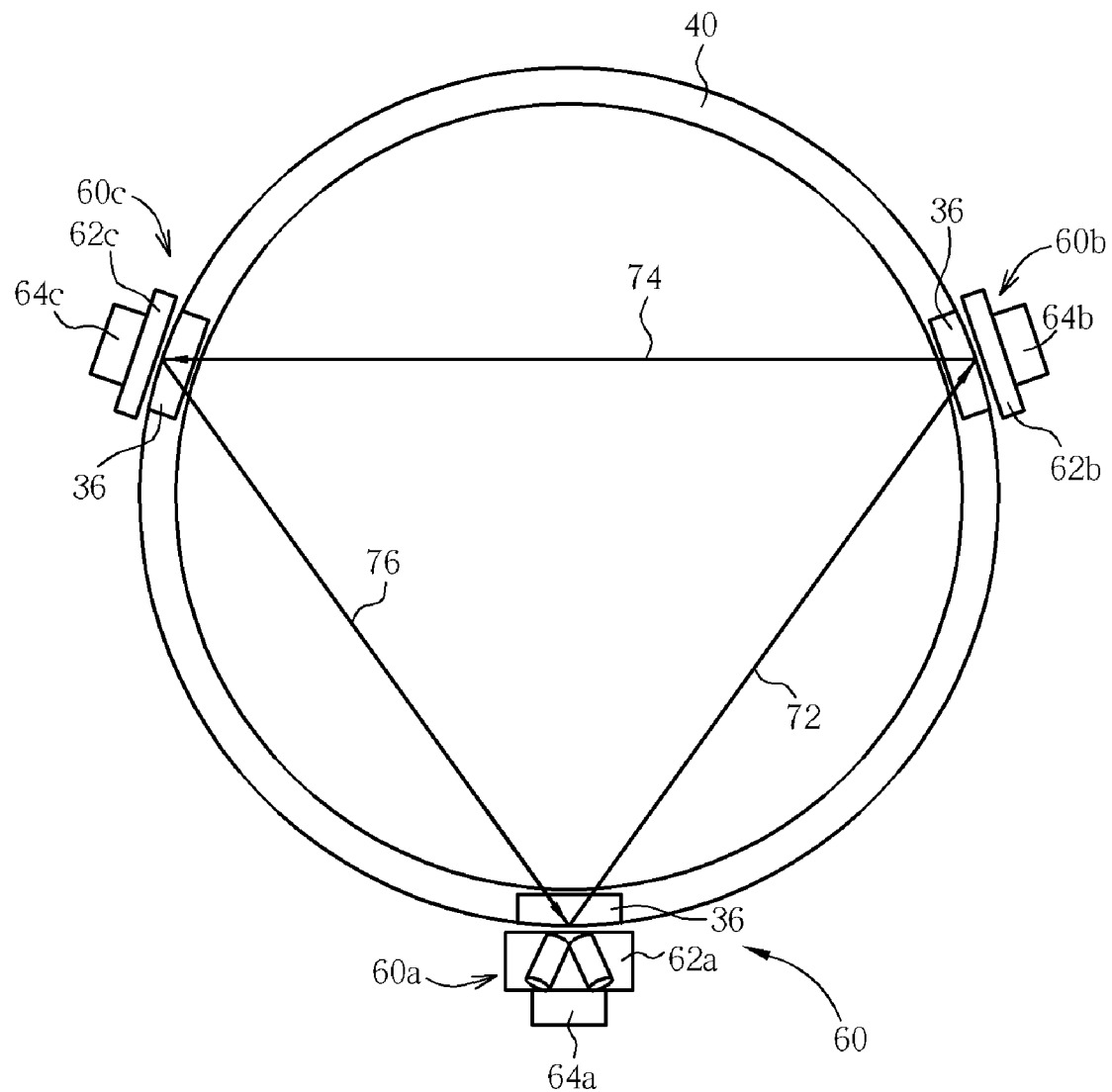
FIG. 4 is a schematic plan view illustrating the optical monitoring system, the annular cam and the upper rollers of an upper portion of a dry etching apparatus in accordance with one preferred embodiment of this invention.
Figure 5:
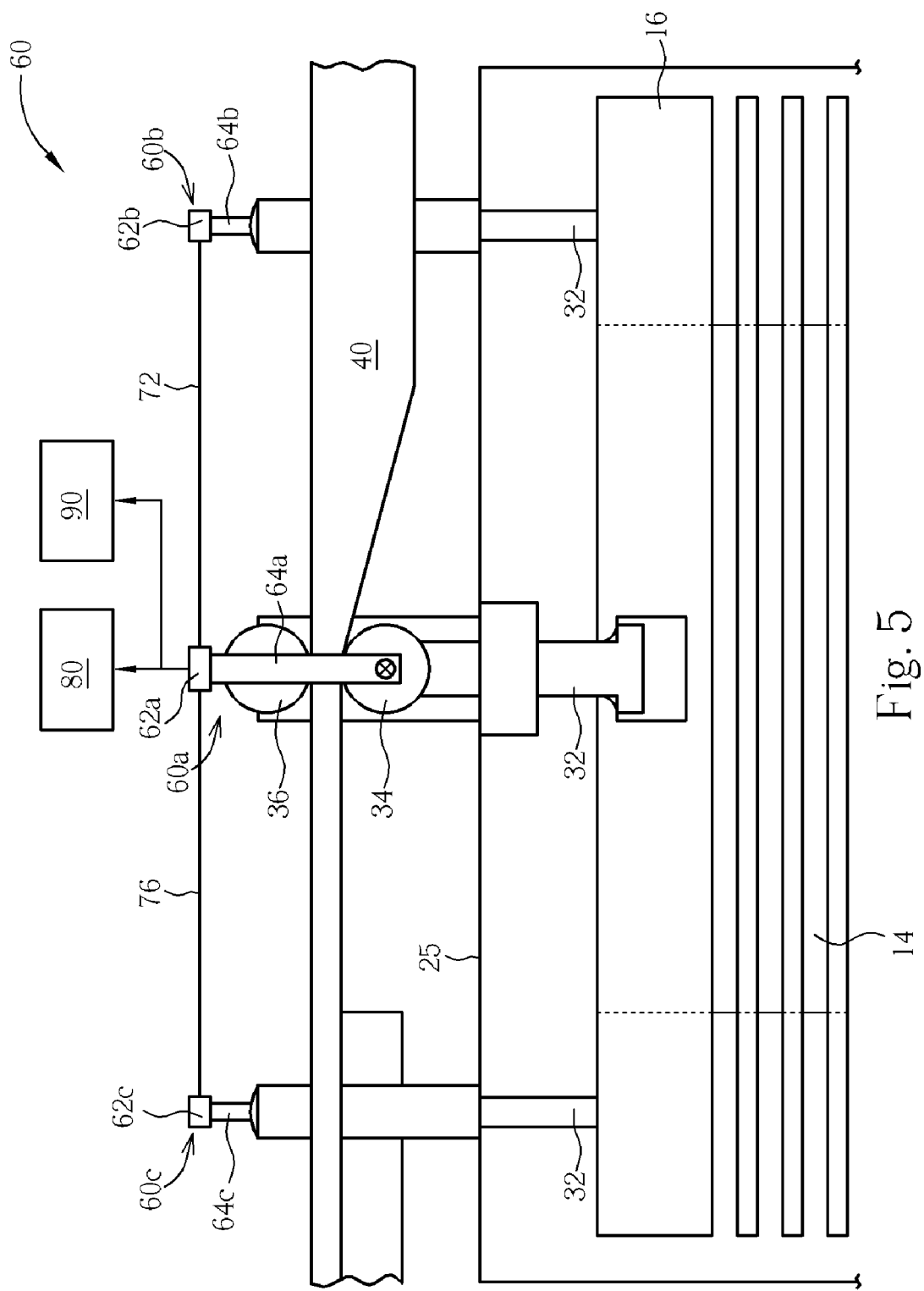
FIG. 5 is a schematic, sectional view demonstrating the optical monitoring system, the annular cam, plunger shafts and the upper portion of a dry etching apparatus in accordance with one preferred embodiment of this invention.

To prevent this, referring to FIGS. 4-5 and briefly to FIG. 3, an optical monitor system 60 comprising three optical elements 60a, 60b and 60c disposed at a 120-degree position are provided along the outer perimeter of the annular cam 40. The optical element 60a comprises a laser diode transmitter and receiver 62a affixed to one end of a supporting member 64a. The optical element 60b comprises an optical reflector element 62b affixed to one end of a supporting member 64b. The optical element 60c comprises an optical reflector element 62c affixed to one end of a supporting member 64c.

The laser diode transmitter and receiver 62a, the optical reflector 62b and 62c are substantially coplanar. The laser diode transmitter and receiver 62a is aimed to direct a laser light beam 72 toward optical reflector element 62b. During the descending or ascending of the WAP ring 16, in a normal situation, the laser light beam 72 is reflected by the optical reflector element 62b and is re-directed toward the optical reflector element 62c, and is again reflected by the optical reflector element 62c and re-directed back toward the laser diode transmitter and receiver 62a and received by the detector thereof.

In an abnormal situation, for example, one of the three plunger shafts 32 does not ascend or descend as the other two normally do because of fatigue of the spring, worn rollers or other causes, then the laser diode transmitter and receiver 62a will not receive and detect any reflected light beam. In such case, as shown in FIG. 5, the laser diode transmitter and receiver 62a triggers an alarm device 80 such as sound or light to notify the operators, and/or sends a signal to a control unit 90 that can immediately stop the motion of the annular cam 40 and the plunger shafts 32, thereby avoiding rubbing or scratching of the WAP ring 16 and the top electrode 14.

According to the preferred embodiment, as shown in FIG. 3, the laser diode transmitter and receiver 62a, the optical reflector elements 62b and 62c protrude from the top of the upper roller for a height H, which is equal to or greater than the distance between the "home position" and "work position" of the WAP ring 16. In any case, the upper roller 36 should not obstruct the light path between the coplanar laser diode transmitter and receiver 62a, the optical reflector elements 62b and 62c.

The other end of each of the supporting members 64a, 64b and 64c is affixed to the respective movable lower roller 34 or plunger shaft 32, such that the optical element 60a, 60b and 60c descend and ascend together with the corresponding lower roller 34 and plunger shaft 32. Preferably, the supporting members 64a, 64b and 64c are made of rigid materials such as stainless steel or metals, but not limited thereto.

The optical reflector elements 62b and 62c may be a mirror or retro-reflective surface such as an adhesive-backed retro-reflective tape. In other cases, the optical reflector elements 62b and 62c may be optical fiber through which light can be transmitted by successive internal reflections. Other light sources and detectors could be used to replace the laser diode transmitter and receiver 62a, for example, infrared light or light emitting diode (LED), though external optic elements might be required to provide a suitable small beam spot size or light intensity at the reflective surface. The accuracy and precision of the optical monitor system 60 may be adjusted by altering the dimension of the optical reflector elements 62b and 62c.

Figure 6:
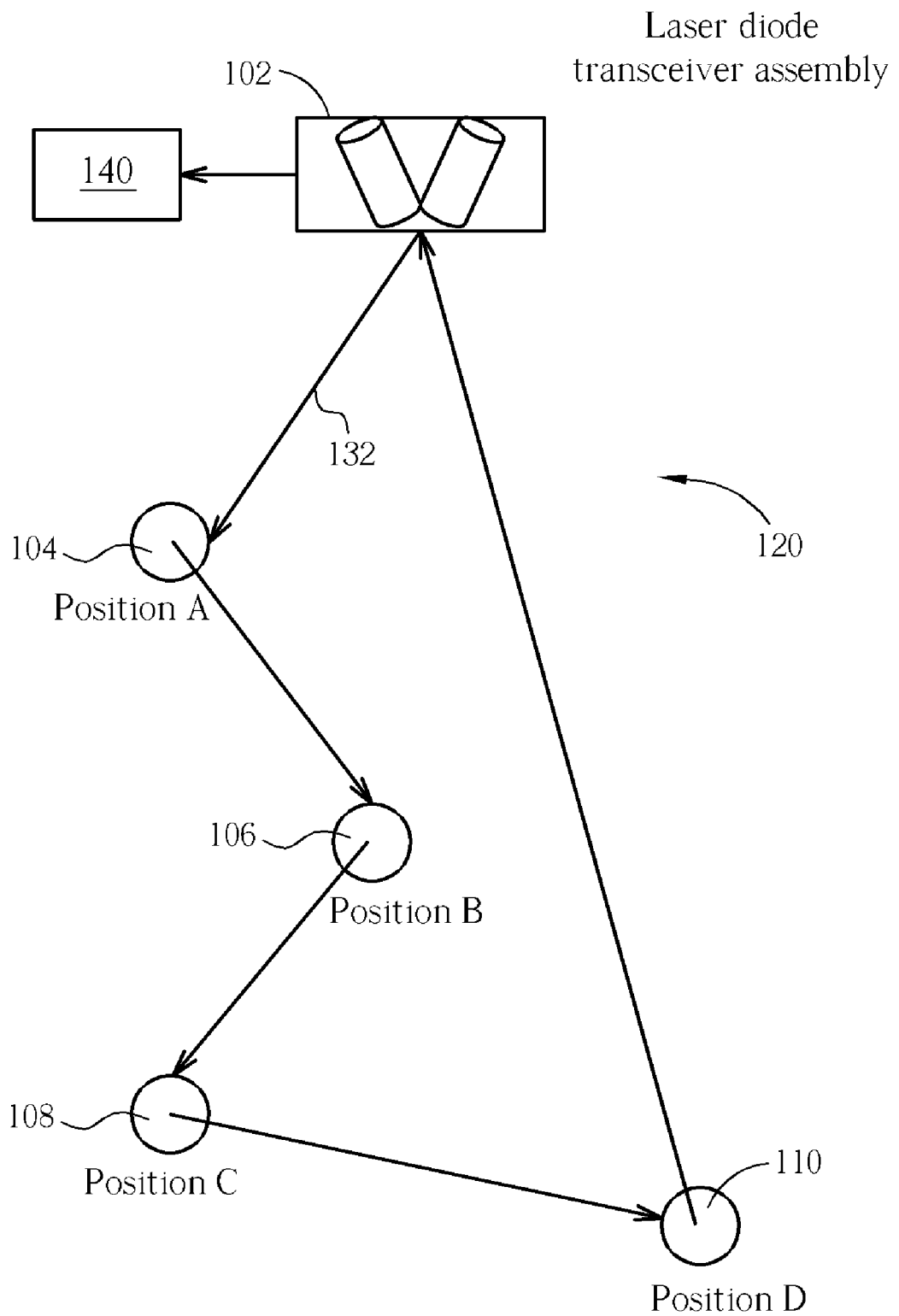
FIG. 6 is a schematic diagram illustrating an optical monitoring system for monitoring or detecting deformation of an object in a three-dimensional fashion according to this invention.

The present invention is also applicable to the field of monitoring deviation of position or deformation of shape due to fatigue of an object such as fuselage in a three-dimensional fashion. FIG. 6 is a schematic diagram demonstrating such application. The monitoring system 120 includes a laser diode transceiver 102 and a plurality of optical reflector elements 104, 106, 108 and 110 disposed at positions A, B, C and D, respectively. The number of the optical reflector elements depends on the light source power. The laser diode transceiver 102 is electrically connected to an alarm 140 such as light or sound. Each of the optical reflector elements 104, 106, 108 and 110 is arranged to reflect the laser light beam 132 originally emanated from the laser diode transceiver 102 and the last optical reflector element 110 directs the reflected light beam back to the laser diode transceiver 102. Once the monitored object (not explicitly shown) deforms and the laser diode transceiver 102 receives no light signal from the last optical reflector element 110 (optical path is changed due to displacement of the positions A, B, C or D), the laser diode transceiver 102 triggers the alarm to notify or warn someone.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical monitoring system for monitoring horizontal ascending or descending of a suspended ring-shaped or disk-shaped object, comprising:
   a ring-shaped or disk-shaped object suspended by and engaged with a plurality vertical plunger shafts, wherein, normally, said vertical plunger shafts move upward and downward reciprocally and coherently, but independently, such that said ring-shaped or disk-shaped object ascends or descends;
   a light transceiver device affixed to one of said vertical plunger shafts; and a plurality optical reflector elements affixed to respective other said plunger shafts, wherein a light beam emanated from said light transceiver is reflected by said optical reflector elements and is eventually re-directed back to said light transceiver device.

2. The optical monitoring system according to claim 1 wherein an alarm that is electrically connected to said light transceiver device.

3. The optical monitoring system according to claim 2 wherein said alarm is triggered once an optical path between said light transceiver device and said optical reflector elements is interrupted.

4. The optical monitoring system according to claim 1 wherein said optical monitoring system is electrically connected to a control unit that control said vertical plunger shafts.

5. The optical monitoring system according to claim 1 wherein said light transceiver device comprises a laser diode transmitter and receiver.

6. The optical monitoring system according to claim 1 wherein said light transceiver device comprises a light source and a light detector.

7. The optical monitoring system according to claim 6 wherein said light source comprises laser, infrared light and light-emitting diode.

8. The optical monitoring system according to claim 1 wherein said optical reflector element includes a mirror.

9. The optical monitoring system according to claim 1 wherein said optical reflector element includes retro-reflective surface or adhesive-backed retro-reflective tape.

10. The optical monitoring system according to claim 1 wherein said light transceiver device and optical reflector elements are substantially coplanar.

11. A dry etching apparatus capable of monitoring motion of a wafer-area-pressure (WAP) ring, comprising:
    a chamber housing encompassing an upper portion and a lower assembly, said upper portion further comprising said WAP ring encircling a top electrode;
    plunger shafts engaging with said WAP ring, wherein said plunger shafts are connected to respective movable lower rollers that are bonded to corresponding fixed upper rollers by using a resilient means;
    an annular cam reciprocally moves between said lower roller and said upper roller along a predetermined direction to protrude said WAP ring downward from said top electrode; and
    an optical monitoring system comprising a light transceiver device and a plurality optical reflector elements affixed to respective said lower rollers or said plunger shafts, wherein a light beam emanated from said light transceiver is reflected by said optical reflector elements and is re-directed back to said light transceiver device.

12. The dry etching apparatus according to claim 11 wherein said optical monitoring system further comprises an alarm that is electrically connected to said light transceiver device.

13. The dry etching apparatus according to claim 12 wherein said alarm is triggered once an optical path between said light transceiver device and said optical reflector elements is interrupted.

14. The dry etching apparatus according to claim 11 wherein said optical monitoring system is electrically connected to a control unit that control motion of said WAP ring.

15. The dry etching apparatus according to claim 11 wherein said light transceiver device comprises a laser diode transmitter and receiver.

16. The dry etching apparatus according to claim 11 wherein said light transceiver device comprises a light source and a light detector.

17. The dry etching apparatus according to claim 16 wherein said light source comprises laser, infrared light and light-emitting diode.

18. The dry etching apparatus according to claim 11 wherein said optical reflector element includes a mirror.

19. The dry etching apparatus according to claim 11 wherein said optical reflector element includes retro-reflective surface or adhesive-backed retro-reflective tape.

20. The dry etching apparatus according to claim 11 wherein said light transceiver device and optical reflector elements are substantially coplanar.

21. The dry etching apparatus according to claim 11 wherein said lower assembly comprises an electrostatic chuck (ESC) and a focus ring.

22. The dry etching apparatus according to claim 11 wherein said resilient means includes a spring.

* * * * *